(12) United States Patent
Liu et al.

(10) Patent No.: US 12,501,667 B2
(45) Date of Patent: Dec. 16, 2025

(54) SUPER JUNCTION SEMICONDUCTOR POWER DEVICE

(71) Applicant: SUZHOU ORIENTAL SEMICONDUCTOR CO., LTD., Jiangsu (CN)

(72) Inventors: Wei Liu, Jiangsu (CN); Lei Liu, Jiangsu (CN); Yuanlin Yuan, Jiangsu (CN); Rui Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 410 days.

(21) Appl. No.: 18/019,083

(22) PCT Filed: Jun. 14, 2022

(86) PCT No.: PCT/CN2022/098644
§ 371 (c)(1),
(2) Date: Jan. 31, 2023

(87) PCT Pub. No.: WO2023/087685
PCT Pub. Date: May 25, 2023

(65) Prior Publication Data
US 2024/0258369 A1    Aug. 1, 2024

(30) Foreign Application Priority Data
Nov. 17, 2021   (CN) .......................... 202111359635.7

(51) Int. Cl.
*H10D 62/10*    (2025.01)
*H10D 30/66*    (2025.01)

(52) U.S. Cl.
CPC .......... *H10D 62/111* (2025.01); *H10D 30/66* (2025.01)

(58) Field of Classification Search
CPC .............................. H10D 62/111; H10D 30/66
See application file for complete search history.

(56) References Cited

U.S. PATENT DOCUMENTS

| | | | |
|---|---|---|---|
| 6,768,169 B2 * | 7/2004 | Tihanyi | H10D 62/111 257/341 |
| 6,888,195 B2 * | 5/2005 | Saito | H10D 62/111 257/302 |

(Continued)

FOREIGN PATENT DOCUMENTS

| | | |
|---|---|---|
| CN | 101013724 A | 8/2007 |
| CN | 104009084 A | 8/2014 |

(Continued)

OTHER PUBLICATIONS

PCT/CN2022/098644 International Search Report dated Aug. 1, 2022.

*Primary Examiner* — Eugene Lee
(74) *Attorney, Agent, or Firm* — Michael Best & Friedrich LLP

(57) ABSTRACT

A super junction semiconductor power device includes an n-type drain region, an n-type drift region, multiple p-type columns, a gate structure, and multiple JFET regions. The width of each of the multiple p-type columns is equal. The spacing between two adjacent p-type columns is equal. The tops of the multiple p-type columns are provided with multiple p-type body regions respectively, and the p-type body regions are in one-to-one correspondence with the p-type columns. The widths of the multiple p-type body regions are equal. An n-type source region is provided in each p-type body region. The gate structure is configured to control a current channel between the n-type source region and the n-type drift region to turn on and turn off. The multiple JFET regions are located on the n-type drift region (Continued)

and between adjacent p-type body regions. The multiple JFET regions are provided with at least two different widths.

4 Claims, 1 Drawing Sheet

(56) References Cited

U.S. PATENT DOCUMENTS

| | | | | |
|---|---|---|---|---|
| 7,576,393 | B2* | 8/2009 | Ono | H10D 30/66 |
| | | | | 257/493 |
| 2007/0177444 | A1* | 8/2007 | Miyajima | H10D 62/235 |
| | | | | 365/221 |
| 2008/0017897 | A1* | 1/2008 | Saito | H10D 30/0297 |
| | | | | 257/E29.136 |
| 2008/0197409 | A1* | 8/2008 | deFresart | H10D 62/156 |
| | | | | 257/E29.066 |
| 2010/0200936 | A1* | 8/2010 | Saito | H10D 12/481 |
| | | | | 257/409 |
| 2016/0035825 | A1* | 2/2016 | Jun | H10D 62/111 |
| | | | | 438/268 |
| 2017/0170264 | A1* | 6/2017 | Mauder | H10D 84/617 |
| 2020/0105529 | A1* | 4/2020 | Ghandi | H10D 30/0291 |
| 2020/0119142 | A1* | 4/2020 | Ono | H10D 30/66 |
| 2022/0130953 | A1* | 4/2022 | Arthur | H10D 30/0291 |
| 2022/0157988 | A1* | 5/2022 | Lee | H10D 62/107 |
| 2024/0038837 | A1* | 2/2024 | Liao | H10D 62/393 |

FOREIGN PATENT DOCUMENTS

| | | |
|---|---|---|
| CN | 104952928 A | 9/2015 |
| CN | 105428397 A | 3/2016 |
| CN | 107464837 A | 12/2017 |
| CN | 107516678 A | 12/2017 |
| CN | 107408574 B | 3/2021 |

* cited by examiner

SUPER JUNCTION SEMICONDUCTOR POWER DEVICE

CROSS-REFERENCE TO RELATED APPLICATION(S)

This is a national stage application filed under 37 U.S.C. 371 based on International Patent Application No. PCT/CN2022/098644, filed Jun. 14, 2022, which claims priority to Chinese Patent Application No. 202111359635.7 filed with the China National Intellectual Property Administration (CNIPA) on Nov. 17, 2021, the disclosures of which are incorporated herein by reference in their entireties.

TECHNICAL FIELD

The present application belongs to the field of semiconductor power device technology, for example, relates to a super junction semiconductor power device.

BACKGROUND

Based on charge balance technology, super junction semiconductor power devices can reduce on-state resistance and parasitic capacitance. The super junction semiconductor power devices have extremely fast switching characteristics. In this manner, switching loss can be reduced, and higher power conversion efficiency can be implemented. When the super junction semiconductor power devices are turned on and off, gate-drain capacitance (Cgd) may change suddenly. As a result, the gate voltage oscillation of the super junction semiconductor power devices is serious.

SUMMARY

The present application provides a super junction semiconductor power device to solve the problem of a sudden change in the gate-drain capacitance of the super junction semiconductor power device in the related art.

An embodiment of the present application provides a super junction semiconductor power device. The super junction semiconductor power device includes an n-type drain region, an n-type drift region, multiple p-type columns, a gate structure, and JFET regions.

The width of each of the multiple p-type columns is equal. The spacing between two adjacent p-type columns is equal.

The top of each of the multiple p-type columns is provided with a p-type body region, and p-type body regions are in one-to-one correspondence with the p-type columns. The widths of the p-type body regions are equal. An n-type source region is provided in a p-type body region.

The gate structure is configured to control a current channel between the n-type source region and the n-type drift region to turn on and turn off.

The JFET regions are located on the n-type drift region and between adjacent p-type body regions.

The JFET regions are provided with at least two different widths.

DETAILED DESCRIPTION

The solution of the present application is completely described hereinafter through specific implementations in conjunction with the drawings in embodiments of the present application.

Figure 1:
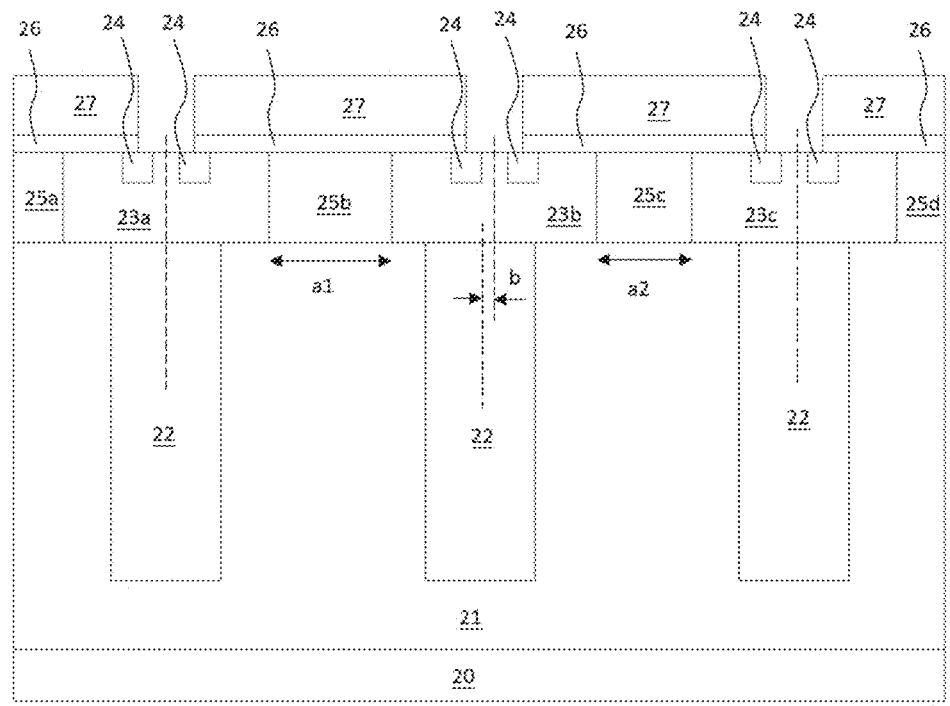
FIG. 1 is a sectional view of an embodiment of a super junction semiconductor power device according to the present application.

FIG. 1 is a sectional view of an embodiment of a super junction semiconductor power device according to the present application. As shown in FIG. 1, an embodiment of the present application provides a super junction semiconductor power device. The device includes an n-type drain region 20, an n-type drift region 21, multiple p-type columns 22, junction field-effect transistor (JFET) regions, and a gate structure. The n-type drain region 20 may be externally connected to a drain voltage through a metal layer. The n-type drift region 21 is located on the n-type drain region 20.

For ease of illustration and description, only three p-type columns 22 are exemplarily shown in FIG. 1. The width of each of the multiple p-type columns 22 is equal. The spacing between two adjacent p-type columns 22 is equal. A charge-balanced pn junction structure is formed between a p-type column 22 and the adjacent n-type drift region 21.

The top of each of the multiple p-type columns 22 is provided with a p-type body region, and p-type body regions are in one-to-one correspondence with the p-type columns 22. FIG. 1 exemplarily shows three p-type body regions: p-type body region 23$a$, p-type body region 23$b$, and p-type body region 23$c$. The widths of the p-type body regions are equal. The widths of the p-type body regions are configured to be equal, so that the layout design dimension of each p-type body region may be the same. At the same time, the layout design dimension of each n-type source region 24 is also the same. Thus, the design of the super junction semiconductor power device is simplified. In one embodiment, the current channel length in each p-type body region may be equal, and the consistency of the super junction semiconductor power device is not affected.

The junction field-effect transistor (JFET) regions are located on the n-type drift region 21 and between adjacent p-type body regions. The JFET regions are parasitic junction field-effect transistor regions in the super junction power device. FIG. 1 exemplarily shows four JFET regions: JFET region 25$a$, JFET region 25$b$, JFET region 25$c$, and JFET region 25$d$. The JFET regions are provided with at least two different widths. For example, in FIG. 1, the width of JFET region 25$b$ is set to a1, and the width of JFET region 25$c$ is set to a2.

The width of each of the multiple p-type columns 22 is equal, and the spacing between adjacent p-type columns 22 is equal. At the same time, the widths of the p-type body regions are equal. Thus, to implement that the JFET regions have at least two different widths, it is necessary to shift partial p-type body regions relative to the p-type columns 22 corresponding thereto. For example, in FIG. 1, the symmetry axis of p-type body region 23$a$ coincides with the symmetry axis of the p-type column 22 corresponding thereto, the symmetry axis of p-type body region 23$c$ coincides with the symmetry axis of the p-type column 22 corresponding thereto, and the symmetry axis of p-type body region 23$b$ is shifted to the right by distance b relative to the symmetry axis of the p-type column 22 corresponding thereto. Thus, the difference between width a1 of JFET region 25$b$ and width a2 of JFET region 25$c$ is 2b.

At least one p-type body region is configured to be shifted. In this manner, the JFET regions have two or more different widths. In one embodiment, the widths of the JFET regions are sequentially set to C, C+1D, C, C+1D, C, . . . , that is, the widths of at least partial JFET regions have two different width values and are cyclically set at intervals in sequence; or the widths of the JFET regions are sequentially set to: C, C+1D, . . . , C+nD, C+(n−1) D, . . . , C, C+1D, . . . , C+nD, C+(n−1) D, . . . , C, . . . , that is, the widths of at least partial JFET regions are first sequentially increased, then sequentially decreased, and then sequentially increased, and then sequentially decreased, and so on; or the widths of the JFET regions are sequentially set to: C, C, . . . , C+1D, C+1D, . . . , C+nD, C+nD, . . . , C+(n−1) D, C+(n−1) D, . . . , C, C, . . . , that is, the JFET regions includes multiple JFET region groups, where the widths of the JFET regions in the same JFET region group are the same, and the widths of the JFET regions in different JFET region groups are first sequentially increased and then sequentially decreased, and so on. n≥2, and n is an integer. C denotes a basic width of the JFET regions, and C>0. D denotes a varying width of the JFET regions, and D>0. The specific values of n, C, and D are determined according to the design requirements. JFET region structures of different widths are configured. When the super junction semiconductor power device is turned on and off, the JFET regions are gradually depleted as a source-drain voltage rises. A JFET region with a small width is first depleted. Gate-drain capacitance may suddenly drop at this source-drain voltage point. Then, JFET regions with slightly wider widths are sequentially depleted as source-drain voltages rise. The gate-drain capacitance may suddenly drop at these source-drain voltage points in sequence. In this manner, the sudden change point of the gate-drain capacitance of the super junction semiconductor power device is divided into several different source-drain voltage points, so that the sudden change speed of the gate-drain capacitance is reduced when the super junction semiconductor power device is turned on and off, thereby reducing the gate voltage oscillation of the super junction semiconductor power device.

An n-type source region 24 is provided in each p-type body region. The gate structure is configured to control a current channel between the n-type source region 21 and the n-type drift region 21 to turn on and turn off. In FIG. 1, the gate structure includes a gate dielectric layer 26 covering the current channel-region and the JFET regions of the device and a gate 27 located on the gate dielectric layer 26. This structure may be referred to as a gate of a full gate structure.

Figure 2:
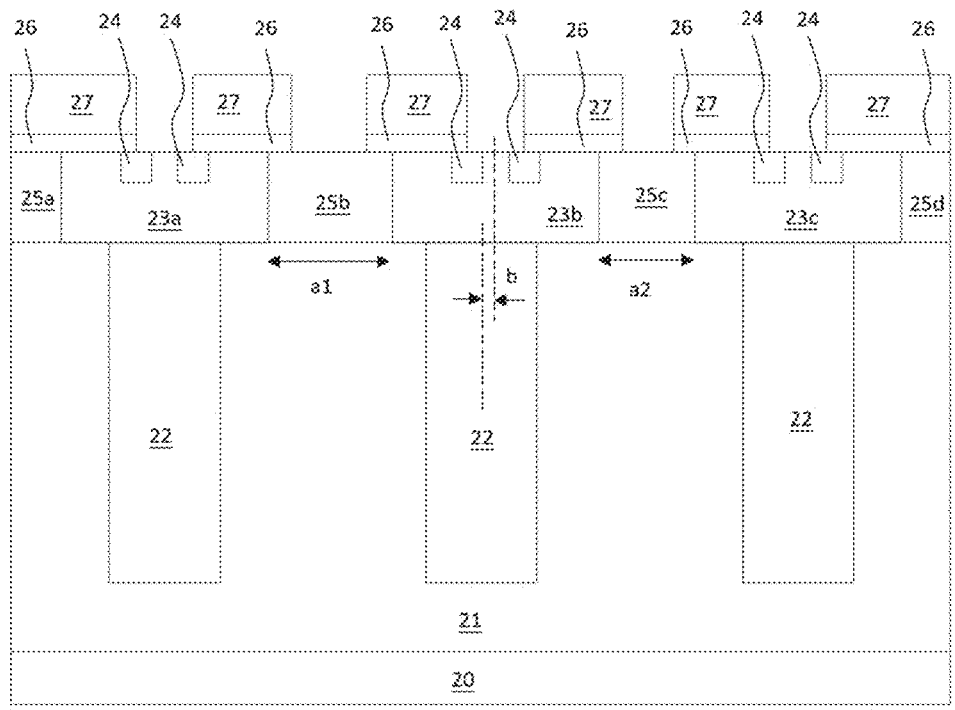
FIG. 2 is a sectional view of another embodiment of a super junction semiconductor power device according to the present application.

FIG. 2 is a sectional view of another embodiment of a super junction semiconductor power device according to the present application. Compared with the super junction semiconductor power device shown in FIG. 1, in FIG. 2, the gate structure of the super junction semiconductor power device includes a gate dielectric layer 26 covering the current channel and a gate 27 located on the gate dielectric layer 26. The gate 27 is disconnected above JFET regions. This structure may be referred to as a gate of a split-gate structure.

In the cell region of a super junction semiconductor power device of the present application, JFET region structures of at least two different widths are used, so that the sudden change speed of the gate-drain capacitance can be reduced when the super junction semiconductor power device is turned on or off, thereby reducing the gate voltage oscillation of the super junction semiconductor power device.

What is claimed is:

1. A super junction semiconductor power device, comprising:
an n-type drain region, an n-type drift region, and a plurality of p-type columns, wherein the plurality of p-type columns have equal widths and are uniformly spaced; and
tops of the plurality of p-type columns are provided with a plurality of p-type body regions respectively, and the plurality of p-type body regions are in one-to-one correspondence with the plurality of p-type columns; widths of the plurality of p-type body regions are equal; and an n-type source region is provided in each of the plurality of p-type body regions;
a gate structure configured to control a current channel between the n-type source region and the n-type drift region to turn on and turn off; and
a plurality of junction field-effect transistor (JFET) regions located on the n-type drift region and between adjacent p-type body regions of the plurality of p-type body regions, wherein the plurality of JFET regions are provided with at least two different widths.

2. The super junction semiconductor power device according to claim 1, wherein widths of the plurality of JFET regions are sequentially set to: C, C+1D, C, C+1D, C, . . . ; or widths of the plurality of JFET regions are sequentially set to: C, C+1D, . . . , C+nD, C+(n−1) D, . . . , C, C+1D, . . . , C+nD, C+(n−1) D, . . . , C, . . . ; or widths of the plurality of JFET regions are sequentially set to: C, C, . . . , C+1D, C+1D, . . . , C+nD, C+nD, . . . , C+(n−1) D, C+(n−1) D, . . . , C, C, . . . , wherein n≥2, and n is an integer; C denotes a basic width of the plurality of JFET regions, and C>0; and D denotes a varying width of the plurality of JFET regions, and D>0.

3. The super junction semiconductor power device according to claim 1, wherein the gate structure comprises a gate dielectric layer covering the current channel and the plurality of JFET regions and a gate located on the gate dielectric layer.

4. The super junction semiconductor power device according to claim 1, wherein the gate structure comprises a gate dielectric layer covering the current channel and a gate located on the gate dielectric layer, and the gate is disconnected above the plurality of JFET regions.

* * * * *